United States Patent
Xiao et al.

(10) Patent No.: US 7,613,758 B2
(45) Date of Patent: Nov. 3, 2009

(54) METHOD FOR OPTIMIZATION OF Q-FILTER KERNEL PARAMETERS

(75) Inventors: Weimin Xiao, Hoffman Estates, IL (US); Magdi A. Mohamed, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 896 days.

(21) Appl. No.: 11/179,104

(22) Filed: Jul. 12, 2005

(65) Prior Publication Data

US 2006/0195499 A1   Aug. 31, 2006

Related U.S. Application Data

(60) Provisional application No. 60/653,445, filed on Feb. 16, 2005.

(51) Int. Cl.
    *G06F 17/10* (2006.01)
(52) U.S. Cl. ...................... 708/300; 708/322
(58) Field of Classification Search .............. 708/322, 708/323
    See application file for complete search history.

(56) References Cited

U.S. PATENT DOCUMENTS

| | | | | | |
|---|---|---|---|---|---|
| 4,438,504 | A | * | 3/1984 | Favin | 708/322 |
| 6,009,448 | A | * | 12/1999 | Jong et al. | 708/322 |
| 6,154,547 | A | * | 11/2000 | Whitecar | 381/94.2 |
| 2002/0181615 | A1 | | 12/2002 | Kuzminsky et al. | |

OTHER PUBLICATIONS

Meng-Al An, "PCT International Search Report and Written Opinion," WIPO, ISA/US, Commissioner for Patents, Alexandria, VA, USA, Jan. 24, 2007.

Nora Lindner, "PCT International Preliminary Report on Patentability," The International Bureau of WIPO, Geneva, Switzerland, Aug. 30, 2007.

* cited by examiner

*Primary Examiner*—Chuong D Ngo

(57) ABSTRACT

A Q-Filter is a reconfigurable technique that performs a continuum of linear and nonlinear filtering operations. It is modeled by unique mathematical structure, utilizing a function called the Q-Measure, defined using a set of adjustable kernel parameters to enable efficient hardware and software implementations of a variety of useful, new and conventional, filtering operations. The Q-Measure is based on an extension of the well-known Sugeno $\lambda$-Measure. In order to optimize the Q-Filter kernel parameters, the value of an error function is minimized. The error function is based on difference between the filtered signal and target signal, with the target signal being a desired result of filtering.

18 Claims, 3 Drawing Sheets

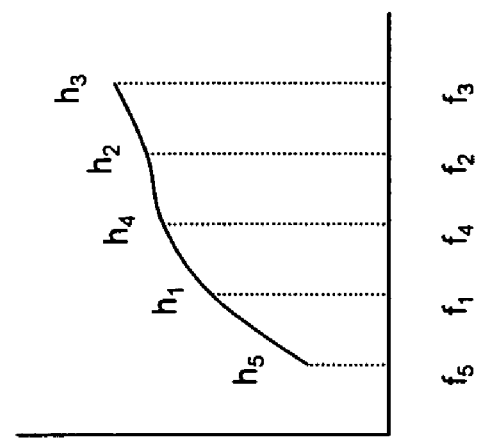
FIG. 2: The Sorted Time Series
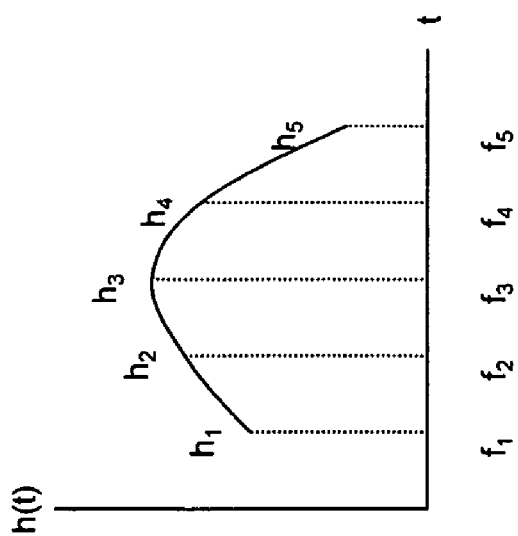
FIG. 1: A Raw Time Series Window

300

400

METHOD FOR OPTIMIZATION OF Q-FILTER KERNEL PARAMETERS

FIELD OF THE INVENTION

The present invention relates generally to optimization of filtering techniques, and in particular, to a method for optimal parameter estimation for such filtering techniques.

BACKGROUND OF THE INVENTION

Digital filtering is essential to most signal processing and image applications. There are several existing techniques for filtering, including linear operators such as average filters, weighted average filters, and nonlinear operators such as median filters, weighted median filters, morphological filters, and stack filters. In practice, signal filtering is difficult due to the fact that there are several filtering methods, algorithms, and parameter settings that may be simultaneously utilized. Additionally, it may be difficult discovering the most appropriate sequence of these existing filtering methods. It would be beneficial if a computationally efficient signal processing technique can be realized that represents several conventional linear and nonlinear filters by adjusting a set of parameters. Such a filtering technique would allow for the elimination of expensive sequences of conventional filtering operations. Moreover, from a hardware point of view, it would be desirable to have a unique architecture that can be used to accelerate the execution of different filters. Therefore, a need exists for filtering a signal that is computationally efficient, and allows for the elimination of expensive sequences of conventional filtering operations. There also exists a need for a method and apparatus for optimizing such a filter.

BRIEF DESCRIPTION OF THE DRAWINGS

FIG. 1 shows an n-point window of time series.

FIG. 2 shows the n-point window of time series of FIG. 1 in an ordered state.

DETAILED DESCRIPTION OF THE DRAWINGS

Figure 3:
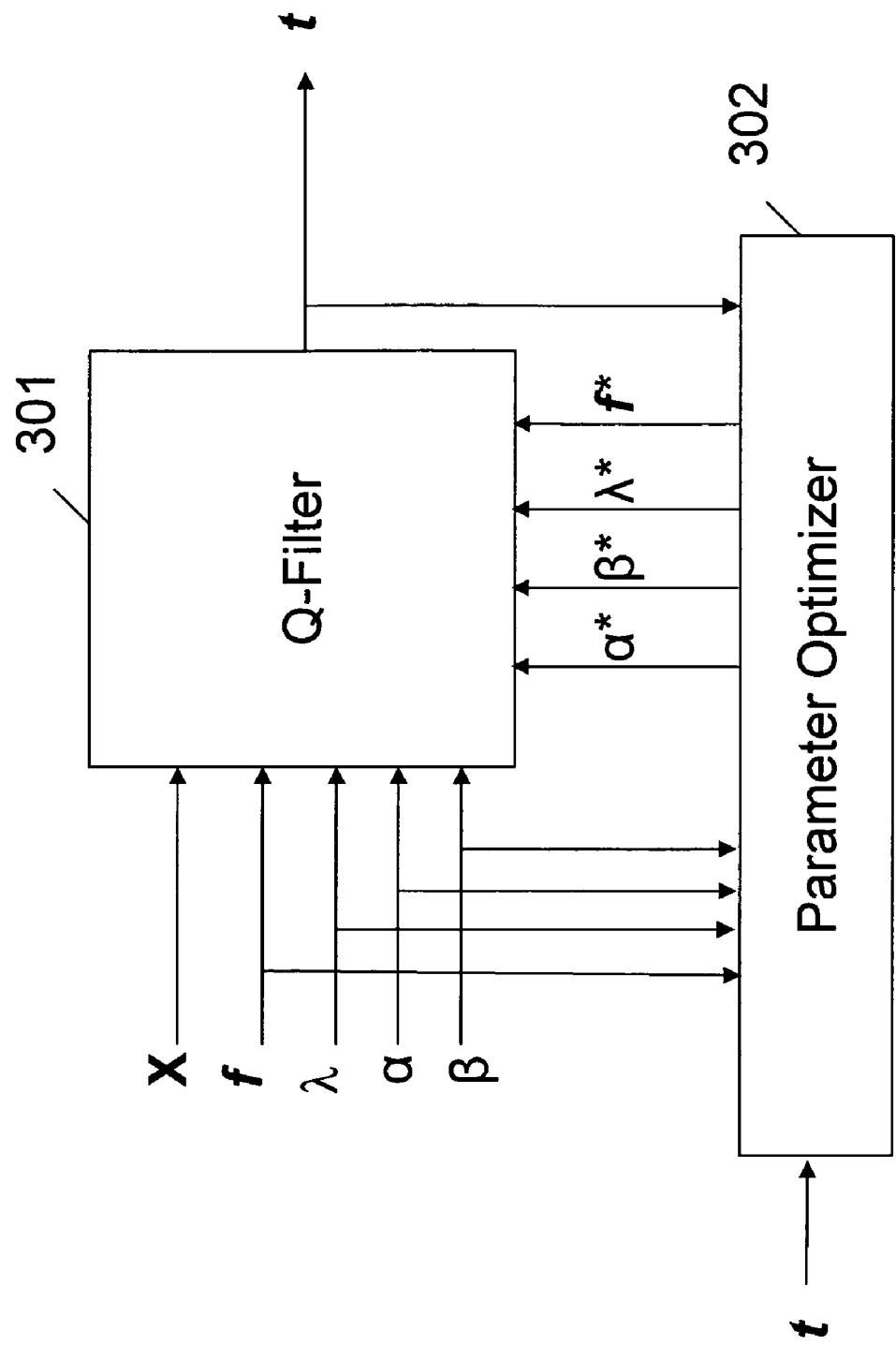
FIG. 3 is a block diagram showing the process of optimizing Q-Filter kernel parameters.

In order to address the above-mentioned need, an efficient method for estimating the kernel parameters of a class of nonlinear filters, referred to as Q-Filters is described herein. The Q-Filter is a reconfigurable filtering technique that performs a continuum of linear and nonlinear filtering operations. It is modeled by a mathematical structure, utilizing a function called the Q-Measure, defined using a set of adjustable kernel parameters to enable efficient hardware and software implementations of a variety of useful filtering operations. The Q-Measure is based on an extension of the well-known Sugeno $\lambda$-Measure.

In order to optimize the Q-Filter kernel parameters, the value of an error function is minimized. The error function is based on difference between the filtered signal and target signal, with the target signal being a desired result of filtering. Two techniques for minimizing the Q-Filter residual error value R are proposed. The first technique expresses the error value as the difference between Q-Filter filtered signal and the target signal where Q-Filter is a function of $\lambda$ and f, with optimization of the Q-Filter occurring by calculating $\partial R/\partial \lambda$ and $\partial R/\partial f$, then going through standard mathematical optimization iterations. The second technique expresses the error value as the difference between Q-Filter linear regression model and the target signal. Thus, the error expression is a function of $\lambda$, f, $\alpha$ and $\beta$ (where $\alpha$ and $\beta$ are linear-regression coefficients). Optimization of the Q-Filter kernel parameters ($\lambda$, f, $\alpha$ and $\beta$) occurs by calculating $\partial R/\partial \lambda$, $\partial R/\partial f$ $\partial R/\partial \alpha$, and $\partial R/\partial \beta$, and then going through standard mathematical optimization iterations.

As described in U.S. patent application Ser. No. 10/854836, METHOD AND APPARATUS FOR DIGITAL SIGNAL FILTERING, now U.S. Pat. No. 7,117,128 which is incorporated by reference herein, Q-Filters are particularly appropriate for hardware implementation and can be trained to replace sequences of conventional linear and nonlinear filtering operations. A distinctive characteristic of the Q-Filter is its low computational complexity, which makes it appropriate for intelligent applications running on low-power and small-size devices. Q-Filters can enable efficient implementation of new computational intelligence applications on embedded devices, desktop, or base-station platforms.

The present invention encompasses a method for optimizing parameters in a Q-filter. The method comprises the steps of receiving values for $\lambda$, f, and t, and optimizing the filtering operation by minimizing an error function R, wherein R is a function of input signal vector X, $\lambda$, f, t; and t*. The variable t* comprises a vector of filtered signals, while variable $\lambda$ comprises a q-measure scalar parameter value, the variable f comprises a q-measure vector of density generator parameter values, and the variable t comprises a vector of desired target signals.

The present invention additionally encompasses an apparatus comprising a filter parameter optimizer receiving values for $\lambda$, f, and t, and optimizing a filtering operation by minimizing an error function R, wherein R is a function of input signal vector X, $\lambda$, f, t; and t*, where t* comprises a vector of filtered signals.

As discussed in the '836 application, a class of fuzzy measures are utilized that are identified as q-measures. The q-measures are based on a modification of the Sugeno $\lambda$-measure. Prior-art application of the Sugeno $\lambda$-measure has determined the fuzzy density first, in order to compute a unique value of the parameter $\lambda$. In practice, this is not a plausible strategy since values provided by experts, or obtained using some computations, are at best on an interval scale, with arbitrary position of 1. Therefore, scaling of these numbers is arbitrary, and computing $\lambda$ from these numbers is then meaningless. The definition for the q-measure, which is a normalization of $\lambda$-measures, efficiently solves this critical problem. The q-measure formulation de-correlates $\lambda$ and the density. As discussed, the Q-Filter is defined as a Choquet integral with respect to a q-measure over a window of observations. By adjusting the Q-Filter kernel parameters, a single Q-Filter can reshape a time series that may require the application of many different conventional filters. The Q-Filter operation can be described below with reference to FIG. 1 and FIG. 2.

As shown in FIG. 1, for an n-point window of a time series (received signal) $\{h_i\}$, i=1 ... n, and corresponding Q-Filter density parameters $\{f_i\}$, the time series are sorted from low to high based on input values (FIG. 2), and the sorted series is marked as $\{h_{(i)}\}$, where $h_{(i-1)} < h_{(i)} < h_{(i+1)}$. Because the density parameters $\{f_i\}$ change order due to sorting $\{h_i\}$, the changed density parameters are marked as $\{f_{(i)}\}$. FIG. 1 shows an example window of a time series with 5 points $\{h_i\}$ and its corresponding Q-Filter density parameters $\{f_i\}$. FIG. 2 is the sorted sequence. For this example, $h_{(1)}=h_5$, $h_{(2)}=h_1$, $h_{(3)}=h_4$, $h_{(4)}=h_2$, and $h_{(5)}=h_3$. Similarly, we have $f_{(1)}=f_5$, $f_{(2)}=f_1$, $f_{(3)}=f_4$, $f_{(4)}=f_2$, and $f_{(5)}=f_3$.

An un-normalized q-measure $\{\Psi_i\}$ is then calculated using the $\lambda$-rule as follows:

$$\Psi_{n+1}=0 \quad (1.1a)$$

$$\Psi_n=f_{(n)} \quad (1.1b)$$

$$\Psi_i=f_{(i)}+\Psi_{i+1}+\lambda f_{(i)}\Psi_{i+1} \quad (1.1c)$$

The q-measure $\{q_i\}$ and the q-measure differences $\{\Delta q_i\}$ are then calculated:

$$q_i=\Psi_i/\Psi_1 \quad (1.2a)$$

$$\Delta q_i=q_i-q_{i+1} \quad (1.2b)$$

The filtered value $\bar{h}$ from the time series $\{h_i\}$ is then calculated:

$$\bar{h} = \sum_{i=1}^{n} h_{(i)}\Delta q_i = \frac{1}{\psi_1}\sum_{i=1}^{n} h_{(i)}f_{(i)}(1+\lambda\psi_{i+1}) \quad (1.3)$$

where $\lambda\in[-1,\infty)$, and $f_i\in[0,1]$. Assume that a time series $\{h_i\}$ has m points that are more than the Q-Filter's window size n. Applying the Q-Filter operation by sliding this window through the signal $\{h_i\}$ will generate $=$m$-$n$+$1 processed data points forming a new time series $\{\bar{h}_i\}$. Finally, $\{\bar{h}_i\}$ is the filtered time series of the input series $\{h_i\}$.

Parameter Optimization

The behavior of the Q-Filter is determined by its window size n, corresponding density generators $\{f_i\}$, and the parameter $\lambda$. Assume that a time series pair $\{x_i, t_i\}$ exists, where $x_i$ is a noisy signal and $t_i$ is the corresponding target signal. Denote $x=\{x_i\}$ as the noisy signal vector, and $f=\{f_i\}$ as the density generators parameter vector, then the Q-Filter, $Q(x, \lambda, f)$, is a mapping from $\{x_i\}$ to $\{t_i\}$, i.e., $Q(x, \lambda, f)\to t$. By denoting $\{h_i\}$ as $\{x_i\}$, Equation (1.3) can be rewritten as:

$$Q(x, \lambda, f) = \sum_{i=1}^{n} x_{(i)}\Delta q_i = \frac{1}{\psi_1}\sum_{i=1}^{n} x_{(i)}f_{(i)}(1+\lambda\psi_{i+1}) \quad (1.4)$$

Assume that the window size n of a Q-Filter is an odd-number, i.e., n=2k+1, k>0; an input noisy signal series $x_k = (x_0, \ldots, x_{k-1}, x_k, x_{k+1}, \ldots, x_{2k})$ is going to be filtered toward a target signal $t_k$. For a series of noisy signals $\{x_k\}$ and the corresponding target signals $\{t_k\}$, the filtered signals can be expressed as:

$$t^*_k=Q(x_k,\lambda,f) \quad (1.5)$$

The corresponding root-mean-square (RMS) error function can be expressed as:

$$R = \frac{1}{2M}\sum_{k=1}^{M}(t^*_k - t_k)^2 = \frac{1}{2M}\sum_{k=1}^{M}(Q(x_k, \lambda, f) - t_k)^2 \quad (1.6)$$

where M is the number of training samples, i.e., number of n-point windows over the noisy input signal series. The derivative of the residual error function, i.e., Equation (1.5), can be expressed as, $$\frac{\partial R}{\partial \lambda} = \frac{1}{M}\sum_{k=1}^{M}(Q_k - t_k)\frac{\partial Q_k}{\partial \lambda} \quad (1.7a)$$

$$\frac{\partial R}{\partial f_i} = \frac{1}{M}\sum_{k=1}^{M}(Q_k - t_k)\frac{\partial Q_k}{\partial f_i} \quad (1.7b)$$

where, $Q_k=Q(x_k,\lambda,f)$; and $$\frac{\partial Q_k}{\partial \lambda}, \frac{\partial Q_k}{\partial f_i}$$

can be calculated numerically as, $$\frac{\partial Q_k}{\partial \lambda} = \frac{Q_k(\lambda + \Delta\lambda) - Q_k(\lambda)}{\Delta\lambda} \quad (1.8a)$$

$$\frac{\partial Q_k}{\partial f_i} = \frac{Q_k(f_i + \Delta f_i) - Q_k(f)}{\Delta f_i} \quad (1.8b)$$

Thus, for a given window size n, the Q-Filter can be optimized by minimizing Equation (1.6) through optimized $\lambda$ and f.

Regression Model

From Equations (1.1a-c), the un-normalized q-measure $\{\Psi_i\}$ is monotonic, i.e., $\Psi_1 \geq \Psi_2 \geq \ldots \geq \Psi_{n+1}=0$. Thus, the q-measure $\{q_i\}$ and its differences $\{\Delta q_i\}$, i.e., Equations (1.2a-b), due to the constant normalization, have the properties $1=q_1 \geq q_2 \geq \ldots \geq q_{n+1}=0$ and $$\sum_{i=1}^{n}\Delta q_i = 1 \quad (2.1a)$$

$$\Delta q_i \geq 0 \quad (2.1b)$$

From Equation (1.4) and (1.5), we have $$t^* = Q(x, \lambda, f) = \sum_{i=1}^{n} x_{(i)}\Delta q_i = \frac{1}{\psi_1}\sum_{i=1}^{n} x_{(i)}f_{(i)}(1+\lambda\psi_{i+1}) \quad (2.2)$$

We can see that the filtered value is bounded as $t^*\in[\min\{x_i\}, \max\{x_i\}]$. But, the target signals $\{t_k\}$ may not be in the same range as $\{t^*_k\}$ for the application of concern.

Equation (1.4) would have to be scaled to reflect the difference between the observation and their corresponding target values. Thus, a linear-regression modification of Equations (1.5) and (1.6) can be expressed as:

$$t^*_k = \alpha Q(x_k, \lambda, f) + \beta \quad (2.3)$$

$$R = \frac{1}{2M}\sum_{k=1}^{M}(\alpha Q(x_k, \lambda, f) + \beta - t_k)^2 \quad (2.4)$$

where α and β are linear-regression coefficients which can be derived from Equation (2.4) as:

$$\frac{\partial R}{\partial \alpha} = \frac{1}{M}\sum_{k=1}^{M}(\alpha Q_k + \beta - t_k)Q_k = 0 \quad (2.5a)$$

$$\frac{\partial R}{\partial \beta} = \frac{1}{M}\sum_{k=1}^{M}(\alpha Q_k + \beta - t_k) = 0 \quad (2.5b)$$

where $Q_k = Q(x_k, \lambda, f)$. Now Let, $$A = \sum_{k=1}^{M} Q_k^2 \quad (2.6a)$$

$$B = \sum_{k=1}^{M} Q_k \quad (2.6b)$$

$$C = \sum_{k=1}^{M} t_k \quad (2.6c)$$

$$D = \sum_{k=1}^{M} Q_k t_k \quad (2.6d)$$

Then we have:

$$\begin{cases} \alpha = \dfrac{N \cdot D - C \cdot B}{N \cdot A - B \cdot B} \\ \beta = \dfrac{C \cdot A - B \cdot D}{N \cdot A - B \cdot B} \end{cases} \quad (2.7)$$

The above discussion suggests that one would first use the Q-Filter parameter optimization equations (1.5), (1.6), and (1.7a-b) to find optimized values for λ and f, then use Equations (2.6a-d) and (2.7) to find the values for α and β, so that the final filtered results given by Equations (2.3) and (2.4) would be superior to equations (1.5) and (1.6). Finding optimized values for λ and f takes place by finding a localized minimum values for λ and f by setting equations 1.6a and 1.6b equal to zero and solving for λ and f, respectively. Once values for λ and f are known, optimized values for α and β are determined by setting equations 2.5a and 2.5b equal to zero and solving for α and β.

It may be desired to minimize the residual error of the linear regression objective function given by Equation (2.4) directly without first minimizing λ and f then α and β. Derivatives of the equation on λ and f should also be considered as follows:

$$\frac{\partial R}{\partial \lambda} = \frac{1}{M}\sum_{k=1}^{M}(Q_k - t_k)\frac{\partial Q_k}{\partial \lambda} \quad (2.8a)$$

$$\frac{\partial R}{\partial f_i} = \frac{1}{M}\sum_{k=1}^{M}(Q_k - t_k)\frac{\partial Q_k}{\partial f_i} \quad (2.8b)$$

$$\frac{\partial R}{\partial \alpha} = \frac{1}{M}\sum_{k=1}^{M}(\alpha Q_k + \beta - t_k)Q_k \quad (2.8c)$$

$$\frac{\partial R}{\partial \beta} = \frac{1}{M}\sum_{k=1}^{M}(\alpha Q_k + \beta - t_k) \quad (2.8d)$$

Several standard mathematical optimization algorithms exit that use first-order derivatives. The simplest way to minimize the residual error, i.e., Equation (2.4), may be to use the standard steepest descendent method, such as:

$$\min R = \frac{1}{2N}\sum_{k=1}^{N}(\alpha Q(x_k, \lambda, f) + \beta - t_k)^2$$

by iteration:

$$\alpha^* = \alpha - \eta \frac{\partial R}{\partial \alpha}\Delta\alpha \quad (2.9a)$$

$$\beta^* = \beta - \eta \frac{\partial R}{\partial \beta}\Delta\beta \quad (2.9b)$$

$$\lambda^* = \lambda - \eta \frac{\partial R}{\partial \lambda}\Delta\lambda, \lambda \geq -1 \quad (2.9c)$$

$$f_i^* = f_i - \eta \frac{\partial R}{\partial f_i}\Delta f_i, f_i \in [0, 1] \quad (2.9d)$$

where η is a constant step length, e.g., η=0.1. α, β, λ, and $f_i$ are the current value of the variables. Δα, Δβ, Δλ, and $\Delta f_i$ are the step changes for the correspondent variables, and they could be at 1~5% of the value of the current variables and no less than 0.001. The updated α*, β*, λ*, and $f^*_i$ are the values for the next iteration. Initial value of α, β, λ, and $f_i$ could be set as: α=1, β=0, λ=1, and $f_i$=0.5. Those step length, step changes, and initial values may vary depending on different optimization algorithms and signal filtering problems.

FIG. 3 is a block diagram of filter 300. Filter 300 comprises Q-Filter 301 and parameter optimizer 302. Both Q-filter 301 and parameter optimizer 302 preferably comprise logic circuitry such as a microprocessor/controller. As shown, filter 301 comprises an input receiving a signal X to be filtered, an input receiving variable parameter λ, and an input receiving a density generator vector f={$f_1, f_2, \ldots, f_n$}. Optionally, filter 301 may have α and β for inputs. As shown, parameter optimizer 302 receives α, β, λ, $f_i$, t, and t* and determines Δα, Δβ, Δλ, and $\Delta f_i$. Where t is desired output signal and t* is filtered signal. Values for α*, β*, λ*, and $f^*_i$ are output to Q-filter 301 and used to produce t*. During operation of Q-filter 301, the input signal series X={$x_1, x_2, \ldots, x_n$}, is input into the Q-Filter 301 with t* being the output computed as an filtered value of the given input. More particularly, during operation the Q-Filter can utilize logic circuitry (e.g., a microprocessor controller) and memory components to construct a q-measure based on the variable parameter λ and vector f, and outputs a filtered signal based on the q-measure.

Figure 4:
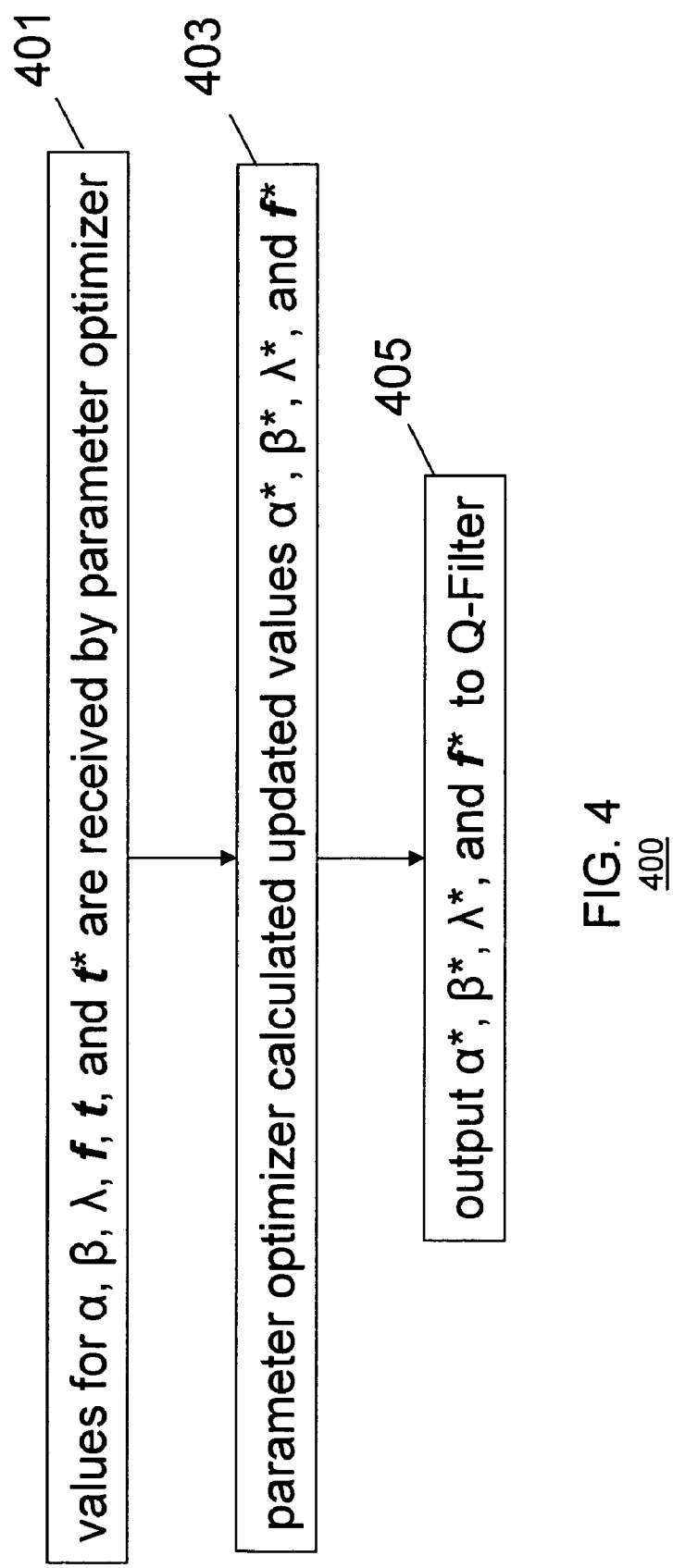
FIG. 4 is a flow chart showing the process of optimizing the Q-Filter kernel parameters of FIG. 3.

FIG. 4 is a flow chart showing operation of parameter optimizer 302. The logic flow begins at step 401 where values for α, β, λ, f, t, and t* are received by parameter optimizer 302. At step 403 parameter optimizer calculated updated values α*, β*, λ*, and f* and outputs these values to Q-Filter 301 (step 405). As discussed, in a first embodiment, the values for α*, β*, λ*, and f* are determined by minimizing Equation (1.6) through optimized λ and f, and in a second embodiment the values for α*, β*, λ*, and f*, are determined via equations 2.9a-d by minimizing Equation (2.4).

While the invention has been particularly shown and described with reference to a particular embodiment, it will be understood by those skilled in the art that various changes in form and details (e.g., depending on the dimensionality of the input signal) may be made therein without departing from the spirit and scope of the invention. It is intended that such changes come within the scope of the following claims.

The invention claimed is:

1. A method for filtering a signal using a Q-filter, the method comprising the steps of:
   receiving with a microprocessor, values for λ, f, and t, wherein λ comprises a q-measure scalar parameter value, f comprises a q-measure vector of density generator parameter values, t comprises a vector of desired target signals; and
   optimizing via the microprocessor filtering parameters by minimizing an error function R, wherein R is a function of input signal vector X, λ, f, t; and t*, where t* comprises a vector of filtered signals; and
   filtering via the microprocessor the signal using the optimized filter parameters.

2. The method of claim 1 wherein R is an average squared error of (t-t*).

3. The method of claim 1 wherein the step of minimizing R(X, λ, f, t, t*) comprises the step of finding values for ∂R/∂λ and ∂R/∂f, where $$R = \frac{1}{2M}\sum_{k=1}^{M}(Q(x_k, \lambda, f) - t_k)^2,$$

and M is a number of training samples.

4. The method of claim 3 wherein:

$$\frac{\partial R}{\partial \lambda} = \frac{1}{M}\sum_{k=1}^{M}(Q_k - t_k)\frac{\partial Q_k}{\partial \lambda}$$

$$\frac{\partial R}{\partial f_i} = \frac{1}{M}\sum_{k=1}^{M}(Q_k - t_k)\frac{\partial Q_k}{\partial f_i}$$

wherein, $Q_k = Q(x_k, \lambda, f)$; and $$\frac{\partial Q_k}{\partial \lambda}, \frac{\partial Q_k}{\partial f_i}$$

can be calculated numerically as, $$\frac{\partial Q_k}{\partial \lambda} = \frac{Q_k(\lambda + \Delta\lambda) - Q_k(\lambda)}{\Delta\lambda}$$

$$\frac{\partial Q_k}{\partial f_i} = \frac{Q_k(f_i + \Delta f_i) - Q_k(f)}{\Delta f_i}.$$

5. The method of claim 4 wherein:

$$Q(x, \lambda, f) = \sum_{i=1}^{n}x_{(i)}\Delta q_i = \frac{1}{\psi_1}\sum_{i=1}^{n}x_{(i)}f_{(i)}(1 + \lambda\psi_{i+1}),$$

and
wherein n is a window size of the Q-Filter; $x_{(i)}$ is a sorted sequence of $x_i$, so that $x_{(1)} \leq x_{(2)} \ldots \leq x_{(n)}$; and $\Psi_i$ are computed recursively for i=n+1, n, . . . , 1, as follows:

$\Psi_{n+1}=0$ $\Psi_n = f_{(n)}$ $\Psi_i = f_{(i)} + \Psi_{i+1} + \lambda f_{(i)}\Psi_{i+1}.$ 6. The method of claim 1 further comprising the step of:
   receiving via the microprocessor linear-regression coefficients for α and β; and
   wherein the step of optimizing comprises the step of minimizing R wherein R is a function of α, β, X, λ, f, t and t*.

7. The method of claim 6 wherein the step of minimizing R(α, β, X, λ, f, t) comprises the step of finding values for ∂R/∂λ and ∂R/∂f, ∂R/∂α, and ∂R/∂β, where $$R = \frac{1}{2M}\sum_{k=1}^{M}(\alpha Q(x_k, \lambda, f) + \beta - t_k)^2.$$

8. The method of claim 7 wherein:

$$\frac{\partial R}{\partial \lambda} = \frac{1}{N}\sum_{k=1}^{N}(\alpha Q_k + \beta - t_k)\alpha\frac{\partial Q_k}{\partial \lambda}$$

$$\frac{\partial R}{\partial f_i} = \frac{1}{N}\sum_{k=1}^{N}(\alpha Q_k + \beta - t_k)\alpha\frac{\partial Q_k}{\partial f_i}$$

$$\frac{\partial R}{\partial \alpha} = \frac{1}{N}\sum_{k=1}^{N}(\alpha Q_k + \beta - t_k)Q_k$$

$$\frac{\partial R}{\partial \beta} = \frac{1}{N}\sum_{k=1}^{N}(\alpha Q_k + \beta - t_k)$$

wherein, $Q_k = Q(x_k, \lambda, f)$; and $$\frac{\partial Q_k}{\partial \lambda}, \frac{\partial Q_k}{\partial f_i}$$

can be calculated numerically as, $$\frac{\partial Q_k}{\partial \lambda} = \frac{Q_k(\lambda + \Delta\lambda) - Q_k(\lambda)}{\Delta\lambda}$$

$$\frac{\partial Q_k}{\partial f_i} = \frac{Q_k(f_i + \Delta f_i) - Q_k(f)}{\Delta f_i}.$$

9. The method of claim 8 wherein:

$$Q(x, \lambda, f) = \sum_{i=1}^{n}x_{(i)}\Delta q_i = \frac{1}{\psi_1}\sum_{i=1}^{n}x_{(i)}f_{(i)}(1 + \lambda\psi_{i+1})$$

wherein n is the window size of the Q-Filter; $x_{(i)}$ is a sorted sequence of $x_i$, so that $x_{(1)} \leq x_{(2)} \ldots \leq x_{(n)}$; and $\Psi_i$ are computed recursively for i=n+1, n, . . . , 1, as follows:

$\Psi_{n+1}=0$ $\Psi_n = f_{(n)}$ $\Psi_i = f_{(i)} + \Psi_{i+1} + \lambda f_{(i)}\Psi_{i+1}.$

10. An apparatus comprising:

a microprocessor configured for receiving values for λ, f, and t, wherein λ comprises a q-measure scalar parameter value, f comprises a q-measure vector of density generator parameter values, t comprises a vector of desired target signals, the microprocessor also configured for optimizing filter parameters by minimizing an error function R, wherein R is a function of input signal vector X, λ, f, t; and t*, where t* comprises a vector of filtered signals; and a filter coupled to the filter parameter optimizer for filtering a signal using the optimized filter parameters.

11. The apparatus of claim 10 wherein R is an average squared error of (t-t*).

12. The apparatus of claim 10 wherein the minimizing of R(X, λ, f, t, t*) takes place by finding local minimum of ∂R/∂λ and ∂R/∂f, where $$R = \frac{1}{2M}\sum_{k=1}^{M}(Q(x_k, \lambda, f) - t_k)^2,$$

and M is a number of training samples.

13. The apparatus of claim 12 wherein:

$$\frac{\partial R}{\partial \lambda} = \frac{1}{M}\sum_{k=1}^{M}(Q_k - t_k)\frac{\partial Q_k}{\partial \lambda}$$

$$\frac{\partial R}{\partial f_i} = \frac{1}{M}\sum_{k=1}^{M}(Q_k - t_k)\frac{\partial Q_k}{\partial f_i}$$

wherein, $Q_k = Q(x_k, \lambda, f)$; and $$\frac{\partial Q_k}{\partial \lambda}, \frac{\partial Q_k}{\partial f_i}$$

can be calculated numerically as, $$\frac{\partial Q_k}{\partial \lambda} = \frac{Q_k(\lambda + \Delta\lambda) - Q_k(\lambda)}{\Delta\lambda}$$

$$\frac{\partial Q_k}{\partial f_i} = \frac{Q_k(f_i + \Delta f_i) - Q_k(f)}{\Delta f_i}.$$

14. The apparatus of claim 13 wherein:

$$Q(x, \lambda, f) = \sum_{i=1}^{n} x_{(i)}\Delta q_i = \frac{1}{\psi_1}\sum_{i=1}^{n} x_{(i)}f_{(i)}(1 + \lambda\psi_{i+1}),$$

and wherein n is a window size of the Q-Filter; $x_{(i)}$ is a sorted sequence of $x_i$, so that $x_{(1)} \leq x_{(2)} \ldots \leq x_{(n)}$; and $\Psi_i$ are computed recursively for i=n+1, n, . . . , 1, as follows:

$\Psi_{n+1} = 0$ $\Psi_n = f_{(n)}$ $\Psi_i = f_{(i)} + \Psi_{i+1} + \lambda f_{(i)}\Psi_{i+1}.$

15. The apparatus of claim 10 wherein the microprocessor configured for receives linear-regression coefficients for α and β and minimizes R wherein R is a function of α, β, X, λ, f, t and t*.

16. The apparatus of claim 15 wherein R(α, β, X, λ, f, t) is minimized by finding local minimum for ∂R/∂λ and ∂R/∂f, ∂R/∂α, and ∂R/∂β, where $$R = \frac{1}{2M}\sum_{k=1}^{M}(\alpha Q(x_k, \lambda, f) + \beta - t_k)^2.$$

17. The apparatus of claim 16 wherein:

$$\frac{\partial R}{\partial \lambda} = \frac{1}{N}\sum_{k=1}^{N}(\alpha Q_k + \beta - t_k)\alpha\frac{\partial Q_k}{\partial \lambda}$$

$$\frac{\partial R}{\partial f_i} = \frac{1}{N}\sum_{k=1}^{N}(\alpha Q_k + \beta - t_k)\alpha\frac{\partial Q_k}{\partial f_i}$$

$$\frac{\partial R}{\partial \alpha} = \frac{1}{N}\sum_{k=1}^{N}(\alpha Q_k + \beta - t_k)Q_k$$

$$\frac{\partial R}{\partial \beta} = \frac{1}{N}\sum_{k=1}^{N}(\alpha Q_k + \beta - t_k)$$

wherein, $Q_k = Q(x_k, \lambda, f)$; and $$\frac{\partial Q_k}{\partial \lambda}, \frac{\partial Q_k}{\partial f_i}$$

can be calculated numerically as, $$\frac{\partial Q_k}{\partial \lambda} = \frac{Q_k(\lambda + \Delta\lambda) - Q_k(\lambda)}{\Delta\lambda}$$

$$\frac{\partial Q_k}{\partial f_i} = \frac{Q_k(f_i + \Delta f_i) - Q_k(f)}{\Delta f_i}.$$

18. The apparatus of claim 17 wherein:

$$Q(x, \lambda, f) = \sum_{i=1}^{n} x_{(i)}\Delta q_i = \frac{1}{\psi_1}\sum_{i=1}^{n} x_{(i)}f_{(i)}(1 + \lambda\psi_{i+1})$$

wherein n is the window size of the Q-Filter; $x_{(i)}$ is a sorted sequence of $x_i$, so that $x_{(1)} \leq x_{(2)} \ldots \leq x_{(n)}$; and $\Psi_i$ are computed recursively for i=n+1, n, . . . , 1, as follows:

$\Psi_{n+1} = 0$ $\Psi_n = f_{(n)}$ $\Psi_i = f_{(i)} + \Psi_{i+1} + \lambda f_{(i)}\Psi_{i+1}.$

* * * * *